United States Patent [19]

Tavana et al.

[11] Patent Number: 4,698,525
[45] Date of Patent: Oct. 6, 1987

[54] BUFFERED MILLER CURRENT COMPENSATING CIRCUIT

[75] Inventors: Danesh Tavana, San Jose; Sing Y. Wong, Sunnyvale, both of Calif.

[73] Assignee: Monolithic Memories, Inc., Santa Clara, Calif.

[21] Appl. No.: 804,192

[22] Filed: Dec. 3, 1985

[51] Int. Cl.⁴ .................. H03K 19/080; H03K 19/003; H03K 3/33
[52] U.S. Cl. .................................... 307/456; 307/443; 307/300
[58] Field of Search ............... 307/454, 456, 443, 475, 307/270, 246, 300, 473

[56] References Cited

U.S. PATENT DOCUMENTS

| | | | |
|---|---|---|---|
| 4,006,370 | 2/1977 | Erler | 307/300 |
| 4,132,906 | 1/1979 | Allen | 307/443 |
| 4,321,490 | 3/1982 | Bechdolt | 307/456 |
| 4,330,723 | 5/1982 | Griffith | 307/456 |
| 4,449,063 | 5/1984 | Omichi et al. | 307/456 |

*Primary Examiner*—Stanley D. Miller
*Assistant Examiner*—Trong Quang Phan
*Attorney, Agent, or Firm*—Alan H. MacPherson; Paul J. Winters; Richard Franklin

[57] ABSTRACT

A TTL inverting output circuit (50) which uses the collector (65) of a parallel phase splitter transistor (Q11) where the voltage changes in phase with the circuit output signal Io to control an active circuit (70) which diverts charge from the base (23) of the output pull-down transistor (Q3).

5 Claims, 5 Drawing Figures

BUFFERED MILLER CURRENT COMPENSATING CIRCUIT

BACKGROUND OF THE INVENTION

This invention relates to transistor transistor logic (TTL) output circuits, and more particularly to a circuit which compensates for so-called "Miller current," a current pulse that charges the capacitance of the base-collector junction during the turn-off of an output "sink" transistor. This current pulse momentarily restarts the sink transistor and degrades the output circuit signal.

A simplified inverting output circuit 10 is shown in FIG. 1. A high voltage input signal Ii applied to input lead 15 produces an inverted and amplified low voltage output signal Io at output lead 80. Conversely, a low voltage input signal Ii produces a high voltage output signal Io. The drive circuit, not shown, providing input signal Ii is isolated or "buffered" by circuit 10 from effects of a load circuit 90 connected to output lead 80.

Input signal phase splitter stage 20 controls and alternately turns on current sink stage 30 and current source stage 40. A high input signal Ii received at input lead 15 and applied to the base of NPN transistor Q1 causes transistor Q1 to conduct. Current from the emitter of transistor Q1 to the base of NPN transistor Q2 causes transistor Q2 to conduct a high "sink control" Q signal, which activates sink 30 when applied to the base of NPN transistor Q3, causing it to conduct. The collector of transistor Q3 draws, "pulls," or "sinks" current from output lead 80 connected to external capacitance or load 90, through its collector-emitter current path and out its ground lead.

A low input signal Ii applied to input lead 15 and thus to the base of transistor Q1 stops current through transistor Q1 and hence through transistor Q2, allowing the "source control" voltage of node 24 at the bottom of resistor R2 to rise, which turns on NPN transistor Q4 and NPN transistor Q5. The emitter of transistor Q5 "sources" or "pushes" current through inverter output lead 80 to load 90.

Output transistors Q3 and Q5 must be physically larger than other transistors in inverter circuit 10 to provide an output current effective to drive or switch the output load 90 capacitance quickly. The large capacitance of the base of transistor Q3 stores charge during conduction, which must be discharged to turn off transistor Q3 in switching to a high output signal Io. Resistor R6 provides a conductive path to discharge the base of transistor Q3 to ground. Transistor Q3 also has a large collector-base capacitance, known as "Miller capacitance" Cm. FIG. 2 shows an equivalent circuit model of sink transistor Q3, in which Miller capacitance Cm is represented distinct from, and connected in parallel to, the base-collector junction.

In switching output signal Io, phase splitter stage 20 (FIG. 1) turns on current source stage 40 simultaneously with turning off sink stage 30. When both transistors Q3 and Q5 are midway in switching, the forward bias of the base-emitter junction of transistor Q3 is falling below 0.7 volts while transistor Q5 is switching on and raising the voltage of output lead 80. The rapidly increasing-reverse bias of the base-collector junction of transistor Q3 causes a transient "Miller current" $Im = Cm(dv/dt)$ from output lead 80, to charge Miller capacitance Cm. Thus, Miller current charging capacitance Cm is proportional to the rate of change of the collector-base voltage (dv/dt) of transistor Q3. Miller current is more of a problem when output signal Io drives a load 90 having a low capacitance, which is charged rapidly and allows a faster voltage rise on the collector of transistor Q3, coupling a larger (albeit briefer) Miller current into the base of transistor Q3. If the base-emitter junction of transistor Q3 is forward biased, then part of current Im will flow across the base-emitter junction of transistor Q3 as current Ib. Current Ib originates from charging the Miller capacitance Cm, rather than from a control signal applied to the base lead as in usual transistor operation. While Miller current Im does offset output current Io by a small amount, this would not be serious except that current Ib momentarily restarts transistor Q3, sinking collector current $If = Ib$ times the beta of transistor Q3. With typical transistor Q3 beta values of 50, this undesired collector current can be rather large. Output node current $Ic = Im + If$ causes a dip, ("spike" or "glitch") in the rising output signal Io, as shown in FIG. 3. This draws current spikes from power supply Vcc, wasting power and causing excessive heating. If the glitches are large enough that signal Io falls below the threshold of load stage 90, the glitches can propagate beyond load 90 into a connected system (not shown).

Miller current Im cannot be prevented, but, by lowering the voltage on the base of transistor Q3, Miller current Im can be split into current Ib and a current Id (FIG. 2) which is diverted out the base lead and flows away from the base. Since $Ib = Im - Id$, any of current Im that is diverted from current Ib to current Id is not beta multiplied to cause current If spikes in output current Io. If all of current Ib were diverted as current Id, there would be no current If, and Miller current would not be a serious problem. Resistor R6 of FIG. 1 is a passive circuit element which sinks a constant amount of current depending on the value of the resistance and of the voltage across it. Resistance R6 provides the least Miller current protection of the prior art circuits. If the value of the resistance is lowered to shunt more Miller current from the base of transistor Q6 to ground, the overall power consumption of circuit 10 increases.

Other prior art approaches to the problem of Miller current attempt to divert as much of Miller current Im as possible to current Id by means such as the circuits 4a–4d shown in FIG. 4. Prior art circuit 4a uses transistor Q6a connected by resistors R4a to the base of transistor Q3. Circuit 4a is advantageous over resistor R6 mainly in compensating for manufacturing and/or temperature caused variations in the beta of transistor Q3. However, there is no feedback path from a node varying with output signal Io to actively turn on transistor Q6a during a low-to-high output signal transition, so circuit 4a is not very effective in compensating for Miller current.

Other prior art Miller compensating circuits divert charge from the base of transistor Q3 using a transistor as an active element with its base capacitively coupled to, and controlled by, a node in output inverter 10 where the voltage changes in phase with the voltage of output signal Io. For example, in U.S. Pats. No. 4,006,370 to Erler and 4,321,490 to Bechdolt, circuits similar to that shown in FIG. 4b include a relatively large capacitor Cb connected to output lead 80. When transistor Q3 is turning off and transistor Q5 is turning on so that the voltage V of output signal Io is rising, capacitor Cb is charged by a current $I4b = Cb(ddv/dt)$.

This is amplified into a transistor Q6b collector current Id=(beta) I4b, to divert current Id from base current Ib and suppress current If (FIG. 2). However, capacitive coupling of capacitor Cb exposes the base of transistor Q3 to adverse effects due to noise from load 90, which can charge capacitor Cb, activate transistor Q6b and accidentally discharge the base of Q3, causing a current spike in output signal Io.

One problem of exposure to "noise" from output load 90 arises during "in-circuit emulation" or testing of a system in which a load circuit 90 is connected to output lead 80. If it is desired to test the system with a low inverter 10 output signal Io, yet for some reason forcing a high signal Io to load 90, a test probe (not shown) is connected to output lead 80 to force a high signal Io. Overriding signal transistor Q3 to rise and causes a current I4b to turn on transistor Q6b, diverting current Ib from, and tending to turn off, transistor Q3 and allowing lead 80, already forced high, to go even higher. However, once the voltage of output lead 80 reaches its upper limit and stops rising, current I4b stops, transistor Q6b stops diverting current Id, transistor Q3 resumes sinking current, and the voltage of output lead 80 starts falling. Because the test probe continues to force output lead 80 high, the output voltage on lead 80 starts oscillating, which, with an appropriate RC time constant in the test probe and/or load circuit 90, can interfere with the desired test.

Other prior art Miller compensating circuits use a capacitor less directly coupled to the output lead. In U.S. Pat. No. 4,132,906 to Allen, a circuit such as circuit 4c connects capacitor Cc to the emitter of transistor Q4 in order to drive Miller current shunt transistor Q6c. This has the disadvantage of not fully buffering Miller compensating circuit 4c from output lead 80, because the base-emitter junction of transistor Q5 acts as a capacitor which is connected in series with capacitor Cc, thereby allowing the Miller current compensating circuit to be undesirably influenced as the voltage of output signal Io rises.

U.S. Pat. No. 4,449,063 to Ohmichi connects one lead of a capacitor Cd to source control node 24 at the bottom of resistor R2, as shown in FIG. 4d. This reduces the adverse effect of capacitive coupling between output lead 80 and the base of shunt transistor Q6d. However, resistively pulled up source control node 24 is excessively loaded by the large capacitance of capacitor Cd, which degrades the switching speed of an output circuit 10 using a compensation circuit such as circuit 4d.

There is therefore a need for a Miller compensating circuit which avoids the prior art drawbacks of capacitively coupling a shunt transistor to the inverter output lead 80, increasing the load on the source stage and exposing the sink stage to noise from the output load.

SUMMARY

It is therefore an object of this invention to provide an output circuit producing improved low to high waveform transitions.

Another object is to provide a compensating circuit which diverts Miller current from the base of a pulldown transistor, to avoid an amplified collector current.

Another object is to provide a Miller current compensating circuit which will not cause output signal oscillations during a test with the output signal Io forced high.

The circuit of this invention achieves these and other objects in compensating for Miller current by shunting the base of the sink transistor to a ground potential insufficient for forward biasing, via a shunt transistor which is turned on by a rising voltage at a compensator control node where the voltage changes in phase with the output terminal voltage, but is neither directly nor capacitively coupled to the output terminal. The shunt transistor base is coupled to a compensator control node in an early stage of the inverter, to remain isolated while following the low-to-high output signal transitions.

DETAILED DESCRIPTION

Figure 1:
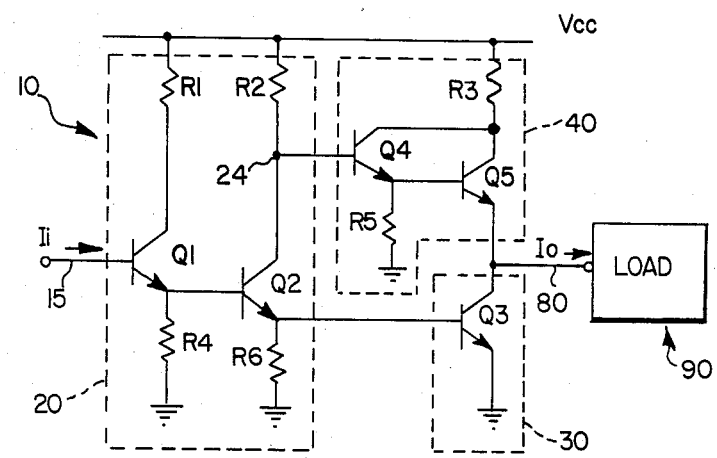
FIG. 1 is a simplified inverting output circuit susceptible to the problem of Miller current.
Figure 2:
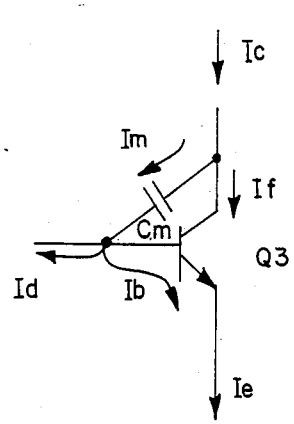
FIG. 2 is an equivalent circuit of the pulldown transistor Q3 of FIG. 1, showing the collector-base junction Miller capacitance distinct from the transistor.
Figure 3:
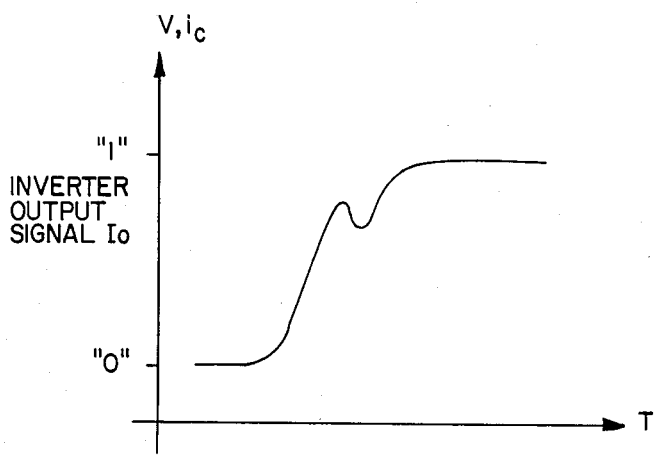
FIG. 3 is a graph of the FIG. 1 inverter output waveform distorted by amplified Miller current.
Figure 4:
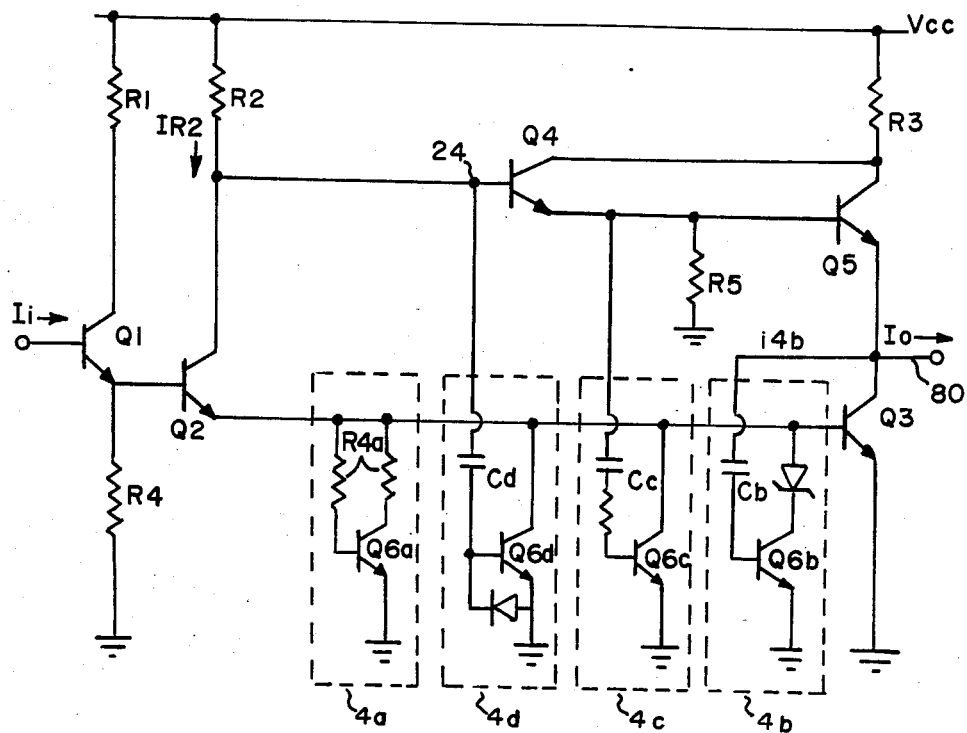
FIG. 4 illustrates four prior art Miller compensating circuits 4a–4d connected, for illustration sake, simultaneously to the circuit of FIG. 1.
Figure 5:
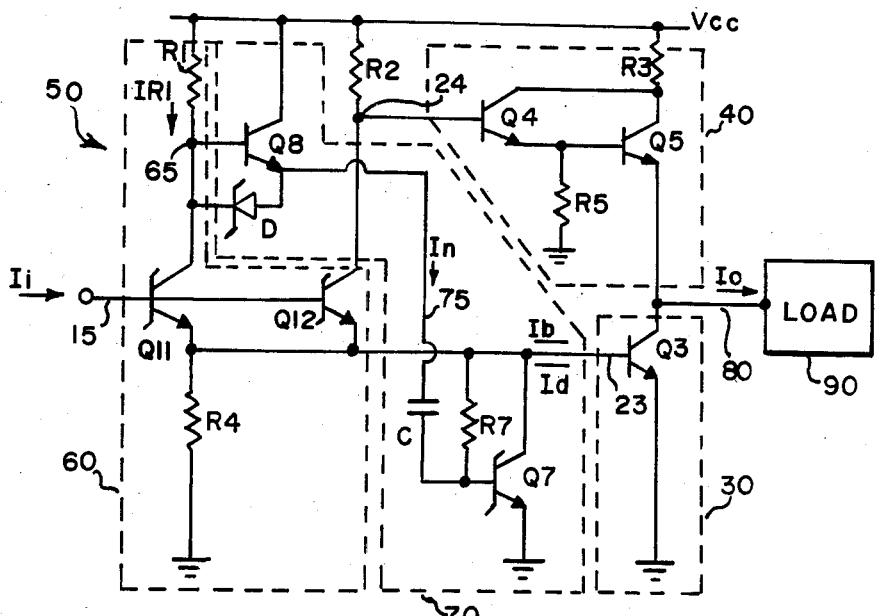
FIG. 5 is a schematic diagram of an inverting output circuit with buffered Miller current compensation according to one embodiment of the present invention.

An inverting output buffer circuit 50 with a Miller compensation circuit 70 according to one embodiment of this invention is illustrated in FIG. 5. Circuit 50 includes an input signal Ii phase splitter stage 60, a current source stage 40, and a current sink stage 30, corresponding to like-numbered stages in the prior art inverters of FIGS. 1 and 4. In an alternate embodiment, phase splitter transistors Q11 and Q12 are functionally similar to transistors Q1 and Q2 in FIG. 1. A high input signal Ii applied to input lead 15 causes phase splitter transistors Q11 and Q12 to conduct. This draws current through resistors R1 and R2, lowers the voltage of source control node 24 at the base of Schottky transistor Q4, and turns off current source stage 40, simultaneously with initiating sink control current Ib to sink control node 23 at the base of Schottky transistor Q3.

Inverting output buffer 50 of FIG. 5 compensates for Miller current with a shunt transistor Q7 driven by a drive capacitor C which is connected, through emitter follower lead 75 of transistor Q8, to Miller compensator control node 65. Node 65 provides effective control for Miller compensator circuit 70 while being essentially isolated from, and not drawing current from, output lead 80. Miller compensator control node 65 is also isolated from source stage 40, so drive capacitor C does not take current from either the base of source transistor Q4 or the base of output transistor Q5. Bipolar transistors are generally manufactured with the emitter more heavily doped than the collector, which results in a given transistor having a higher base-emitter junction capacitance than collector-base capacitance. In prior art circuit 4d (FIG. 4), shunt transistor Q6d drive capacitor Cd is connected to node 24 at the base of transistor Q4. Thus, capacitor Cd is coupled to output lead 80 by the relatively high capacitances of the base-emitter junctions of transistors Q4 and Q5. In contrast, drive capacitor C of the present invention is controlled by node 65, which is coupled to output lead 80 through the base-emitter junction of transistor Q11 in series with the relatively low capacitances of the collector-base junctions of transistors Q3 and Q11. Therefore, in accordance with the teachings of the present invention, Miller compensation control node 65 is more isolated from output lead 80 than is source control node 24. Shunt transistor Q7 is preferably a Schottky transistor. Resistor R7 serves as a beta compensator between the base and collector of shunt transistor Q7.

A falling input signal Ii at input lead 15 of inverting output buffer 50 turns off Schottky transistors Q11 and Q12, allowing the voltage to rise at Miller compensator control node 65 (the base of transistor Q8), which begins conducting current IR1 through resistor R1. The collector of transistor Q8 conducts current from power supply Vcc to produce emitter current. In =IR1 amplified by (beta Q8+1) to charge capacitor C.

Capacitor C can be either a capacitor as shown in FIG. 5 or any reverse biased PN junction functioning as a capacitor, such as the base-emitter capacitance provided by a non-active second emitter, not shown, of shunt transistor Q7 connected to line 75. This second emitter will always be reverse biased to work as a capacitor because the primary emitter of transistor Q7 is connected to ground. When input signal Ii switches from high to low, rising voltage at Miller compensator control node 65 causes current In to turn on shunt transistor Q7, completing a low impedance path to divert Miller current Im from transistor Q3.

When phase splitter transistor Q11 completes switching to a high source control signal, the emitter of transistor Q8 completes charging capacitor C, and line 75 current In ceases. Charge is then trapped on capacitor C (or, in the alternate embodiment, on the non-active second emitter, not shown, of transistor Q7).

Since the voltage on the emitter of transistor Q8 needs to rise each time input signal Ii switches from high to low, Schottky diode D is used to discharge line 75 to about 2VBE above ground when input signal Ii is high and transistor Q11 is thus conducting. Node 75 must be charged and discharged to create a voltage gradient dv/dt across capacitor C. A voltage gradient dv/dt is also obtained when capacitor C is connected directly to Miller compensator control node 65, omitting transistor Q8 and diode D, but the large capacitance C has a large RC time constant, reducing dv/dt. Transistor Q8 preferably provides gain to charge capacitor C more quickly.

A preferred embodiment has been illustrated, of which modifications and adaptations within the scope of the invention will occur to those skilled in the art. The invention is limited only by the scope of the following claims.

I claim:

1. In an inverting output buffer circuit including an input terminal, an output terminal, a power supply terminal, a ground terminal, an input signal phase splitter stage having a sink control node and a source control node, at which said phase splitter stage causes sink and source control currents, in-phase and 180° out-of-phase, respectively with input signal currents, a source stage responsive to a high source control signal to conduct current from the power supply terminal to the output terminal, and a sink stage including a sink transistor responsive to a high sink control signal to conduct current from the output terminal to the ground terminal, the improvement comprising a Miller current compensating circuit comprising:

a chargeable and dischargeable Miller compensator control node connected to the power supply terminal;

a shunt transistor having a collector connected to the sink control node, an emitter connected to the ground terminal, and a base; and means including a capacitor coupling the base of the shunt transistor to the Miller compensator control node.

2. A compensating circuit as in claim 1, said means further comprising a capacitor drive transistor having its collector connected to the power supply terminal, its emitter connected to the capacitor, and its base connected to the Miller compensator control node.

3. A compensating circuit as in claim 2, said means further comprising a diode with its anode connected to the capacitor and to said capacitor drive transistor emitter, and its cathode connected to the Miller compensator control node.

4. A compensating circuit as in claim 3 including a resistor connected between the respective bases of the sink transistor and shunt transistor.

5. A circuit as in claim 3 wherein the shunt transistor is a Schottky transistor and the diode is a Schottky diode.

* * * * *

UNITED STATES PATENT AND TRADEMARK OFFICE
CERTIFICATE OF CORRECTION

PATENT NO. : 4,698,525
DATED : October 6, 1987
INVENTOR(S) : Danesh Tavana and Sing Y. Wong It is certified that error appears in the above-identified patent and that said Letters Patent is hereby corrected as shown below:

Col. 1, line 28, delete the letter "Q" preceding the word "signal".

Col. 2, line 68, delete "(ddv/dt)" and substitute --(dv/dt)--.

Col. 3, line 16, insert between the words "signal" and "transistor" the following: --Io initially causes the voltage on the collector of--.

Signed and Sealed this

Nineteenth Day of April, 1988

Attest:

DONALD J. QUIGG

Attesting Officer

Commissioner of Patents and Trademarks